United States Patent
Su et al.

(10) Patent No.: US 9,653,186 B2
(45) Date of Patent: May 16, 2017

(54) MEMORY-TESTING DEVICE AND MEMORY-TESTING METHOD

(71) Applicant: MediaTek Inc., Hsin-Chu (TW)

(72) Inventors: Chin-Jung Su, Hsinchu (TW); Rei-Fu Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 88 days.

(21) Appl. No.: 14/600,496

(22) Filed: Jan. 20, 2015

(65) Prior Publication Data

US 2015/0228360 A1  Aug. 13, 2015

Related U.S. Application Data (60) Provisional application No. 61/938,961, filed on Feb. 12, 2014.

(51) Int. Cl.
*G11C 29/00* (2006.01)
*G11C 29/56* (2006.01)
*G11C 29/12* (2006.01)

(52) U.S. Cl.
CPC .. *G11C 29/56012* (2013.01); *G11C 29/12015* (2013.01)

(58) Field of Classification Search
CPC ............. G11C 29/56012; G11C 29/12015
See application file for complete search history.

(56) References Cited

U.S. PATENT DOCUMENTS

| | | | | |
|---|---|---|---|---|
| 2005/0135167 A1* | 6/2005 | Manabe | ............... | G11C 7/1072 365/201 |
| 2008/0238476 A1* | 10/2008 | Lewis | ............... | G06F 17/5054 326/40 |
| 2009/0251187 A1* | 10/2009 | Shin | ............... | G11C 7/1051 327/286 |
| 2014/0169119 A1* | 6/2014 | Choi | ............... | G11C 7/22 365/233.12 |
| 2015/0078101 A1* | 3/2015 | Becker | ............... | G11C 7/222 365/189.02 |

* cited by examiner

*Primary Examiner* — April Y Blair
*Assistant Examiner* — Thien D Nguyen
(74) *Attorney, Agent, or Firm* — McClure, Qualey & Rodack, LLP (57) ABSTRACT

A memory-testing device for testing a memory is provided. The memory-testing device includes a testing circuitry and a register. The testing circuitry is coupled to the memory for testing performance of the memory. The register is coupled to the testing circuitry and inputted by a testing clock signal, wherein the testing clock signal is different from an original clock signal of the memory and/or the testing circuitry. The testing clock signal is utilized for adjusting the time when the memory-testing device latches data from the memory to decrease a timing slack of the memory-testing device.

22 Claims, 12 Drawing Sheets

MEMORY-TESTING DEVICE AND MEMORY-TESTING METHOD

CROSS REFERENCE TO RELATED APPLICATIONS

This application claims the benefit of U.S. Provisional Application No. 61/938,961, filed on Feb. 12, 2014, the entirety of which is/are incorporated by reference herein.

BACKGROUND OF THE INVENTION

Field of the Invention

This disclosure relates generally to a memory-testing device and, more particularly, to an effective memory-testing method with an adjustable clock signal to optimize the timing slack of the memory-testing device.

Description of the Related Art

Figure 1A:
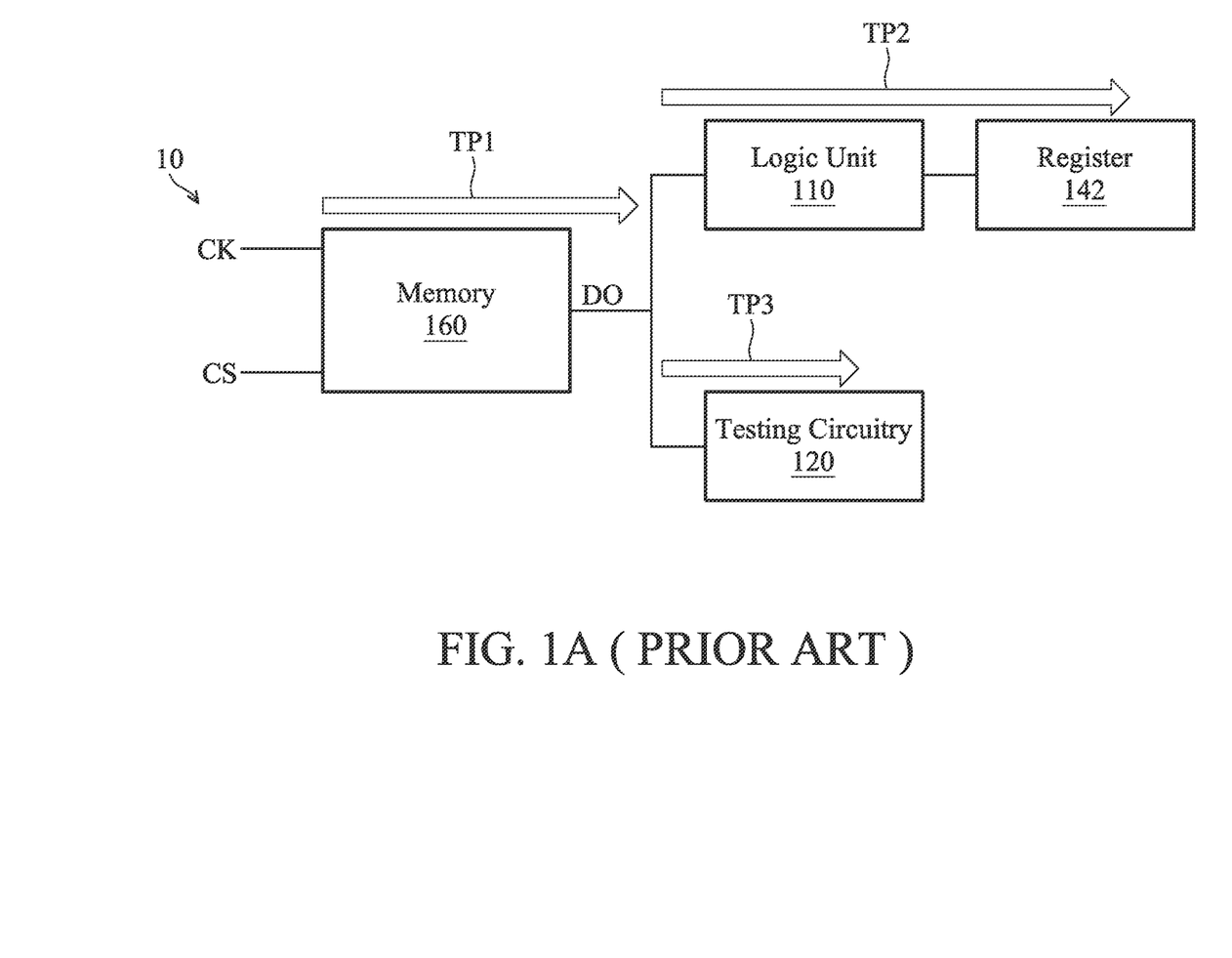
FIG. 1A is a block diagram of a system including a memory performed in a functional mode or a test mode.

FIG. 1A is a block diagram of a system 10 including a memory 160 operated in a functional mode or a test mode. The system 10 includes a logic unit 110, testing circuitry 120, a register 142 and a memory 160. There are several timing paths for accessing the memory 160 including a first timing path TP1 from the original clock signal CK of the memory 160 to the output DO of the memory 160, a second timing path TP2 from the output DO of the memory 160 through the logic unit 110 to the register 142, and a third timing path TP3 from the output DO of the memory 160 to the testing circuitry 120. When the memory 160 is accessed or operated on the functional mode for normal operation, the corresponding timing paths of the functional mode are the first timing path TP1 and the second timing path TP2. When the memory 160 is accessed or operated on the test mode, the corresponding timing paths of the test mode are the first timing path TP1 and the third timing path TP3.

Specifically, the testability mainly depends on the timing margins of the second timing path TP2 and the third timing path TP3, especially when there is a delay or fault on the first timing path TP1. However, if the timing margin of the third timing path TP3 is larger than or looser than the second timing path TP2, the testing reliability and the accuracy of the testing circuitry 120 will deteriorate. For example, on the one hand, the testing result is normally successful when the memory 160 is in the test mode, but on the other hand, the practical performance or result fails when the memory 160 is in the functional mode. Therefore, a better memory-testing method is needed to decrease the gap of the timing margins between the second timing path TP2 and the third timing path TP3 for improving the reliability and accuracy of testing the memory.

Various kinds of testing devices or methods have been utilized to test the timing paths and the performance of the memory 160. For example, the Automatic Test Pattern Generation (ATPG) test has been widely used. When the memory 160 is accessed or operated during the at-speed testing of the ATPG, the critical access should be applied on the memory 160. Since the critical path is from the pre-charging of the bit line to the next access cycle, there could be some failures in the output DO of the memory 160 if the critical path is too tight to pre-charge the bit line to a pre-determined voltage level. In addition, the size of the test pattern of the ATPG is very large. Therefore, the testing procedure of ATPG is inefficient and also costs too much time and money, and another memory-testing method with high efficiency and low cost is needed.

BRIEF SUMMARY OF THE INVENTION

In an embodiment of the present invention, a memory-testing device for testing a memory is provided. The memory-testing device includes a testing circuitry and a register. The testing circuitry is coupled to the memory for testing the performance of the memory. The register is coupled to the testing circuitry and input by a testing clock signal, wherein the testing clock signal is different from the original clock signal of the memory and/or the testing circuitry. The testing clock signal is utilized for adjusting the time when the memory-testing device latches data from the memory to decrease the timing slack of the memory-testing device.

In an embodiment of the present invention, a memory-testing method for testing a memory is provided. The memory-testing method includes generating a testing clock signal of a register wherein the testing clock signal is different from an original clock signal of the memory and/or a testing circuitry utilized for testing performance of the memory; and adjusting the time when the memory-testing device latches data from the memory by the testing clock signal to decrease a timing slack of the memory-testing device.

In an embodiment of the present invention, a memory-testing method for testing a memory is provided. The memory-testing method includes generating a testing clock signal for the memory-testing device utilized for operating a test mode on the memory wherein the testing clock signal is different from an original clock signal of the memory; and controlling a margin of the memory-testing device by regulating the testing clock signal so that a margin of a test mode is approximately equal to or smaller than a margin of a functional mode on the memory.

A detailed description is given in the following embodiments with reference to the accompanying drawings.

BRIEF DESCRIPTION OF THE DRAWINGS

For a more complete understanding of the illustrative embodiments and the advantages thereof, reference is now made to the following descriptions taken in conjunction with the accompanying drawings

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1B:
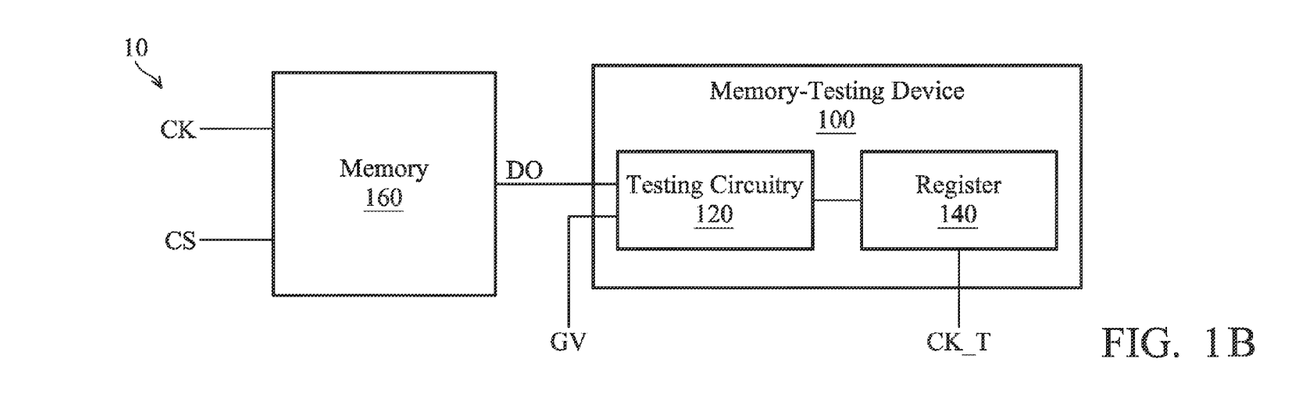
FIG. 1B is a block diagram of a memory and a memory-testing device according to one embodiment of the present invention.

FIG. 1B is a block diagram of a memory 160 and a memory-testing device 100 according to one embodiment of the present invention. The system 10 includes the memory 160 and the memory-testing device 100. The memory 160 receiving an original clock signal CK and a control signal CS. The memory-testing device 100 is utilized to test the memory 160. For example, the memory 160 may be a static random access memory (SRAM), a dynamic random access memory (DRAM), flash memory or any other type of memory. For further illustrations, the memory 160 could include a storage space and read/write circuitry (not shown). The storage space may include multiple blocks and each block may include multiple pages, and it is accessed by the read/write circuitry based on the original clock signal CK.

In one embodiment, the memory-testing device 100 includes testing circuitry 120 and a register 140. For example, the testing circuitry 120 is a built-in self-test (BIST) circuit and the register 140 is a flip-flop. It should be noted that the register 140 can also be located in other devices or modules, such as the testing circuitry 120. In one embodiment, the testing circuitry 120 compares the data from the output DO of the memory 160 with a golden value GV for inspecting the accuracy of the data, and the register 140 stores the data outputted by the testing circuitry 120. The golden value GV could be a pre-determined value for validation or a value obtained from the last operation cycle wherein the memory 160 was accessed.

Figure 1C:
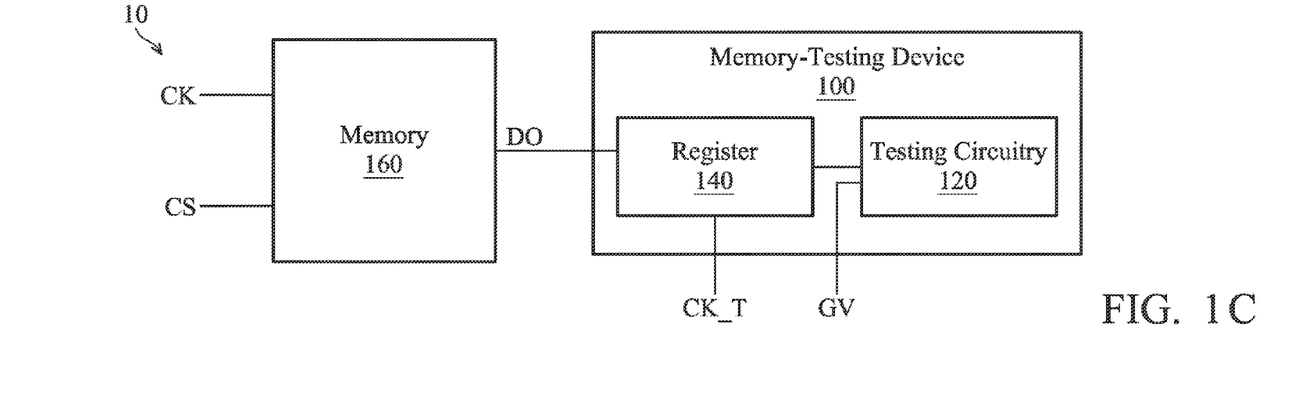
FIG. 1C is another block diagram of a memory and a memory-testing device according to one embodiment of the present invention.

As shown in FIG. 1B, the testing circuitry 120 is coupled to the memory for testing or validating the performance of the memory 160. The register 140 is coupled to the testing circuitry 120 and is input by a testing clock signal CK_T. The testing clock signal CK_T is different from an original clock signal CK of the memory 160 and/or the testing circuitry 120. For example, in one embodiment, the original clock signal CK is the clock signal of the memory 160. In another embodiment, the original clock signal CK is not only the clock signal of the memory 160 but also it is shared with the testing circuitry 120 (not shown). The original clock signal CK is generated by a clock source (not shown). The clock source can be a phase-locked loop (PLL) or any other components suitable for generating at least one clock signal. In one embodiment as shown in FIG. 1B, the testing circuitry 120 is coupled between the memory 160 and the register 140. FIG. 1C is another block diagram of a memory 160 and a memory-testing device 100 according to one embodiment of the present invention. In this embodiment, the register 140 is coupled between the memory 160 and the testing circuitry 120.

It should be noted the testing clock signal CK_T is utilized for adjusting or controlling the time when the memory-testing device 100 latches or obtains data from the memory 160 to decrease a timing slack of the memory-testing device 100. Since the time when the memory-testing device 100 latches data from the memory 160 could be adjusted or regulated according to the testing clock signal CK_T, the timing margin of the third timing path TP3 would be decreased or become tighter so that it is approximately equal to the second timing path TP2. Therefore, the testing reliability and the accuracy of the testing circuitry 120 would be improved by optimizing the timing slack of the memory-testing device 100.

Figure 2:
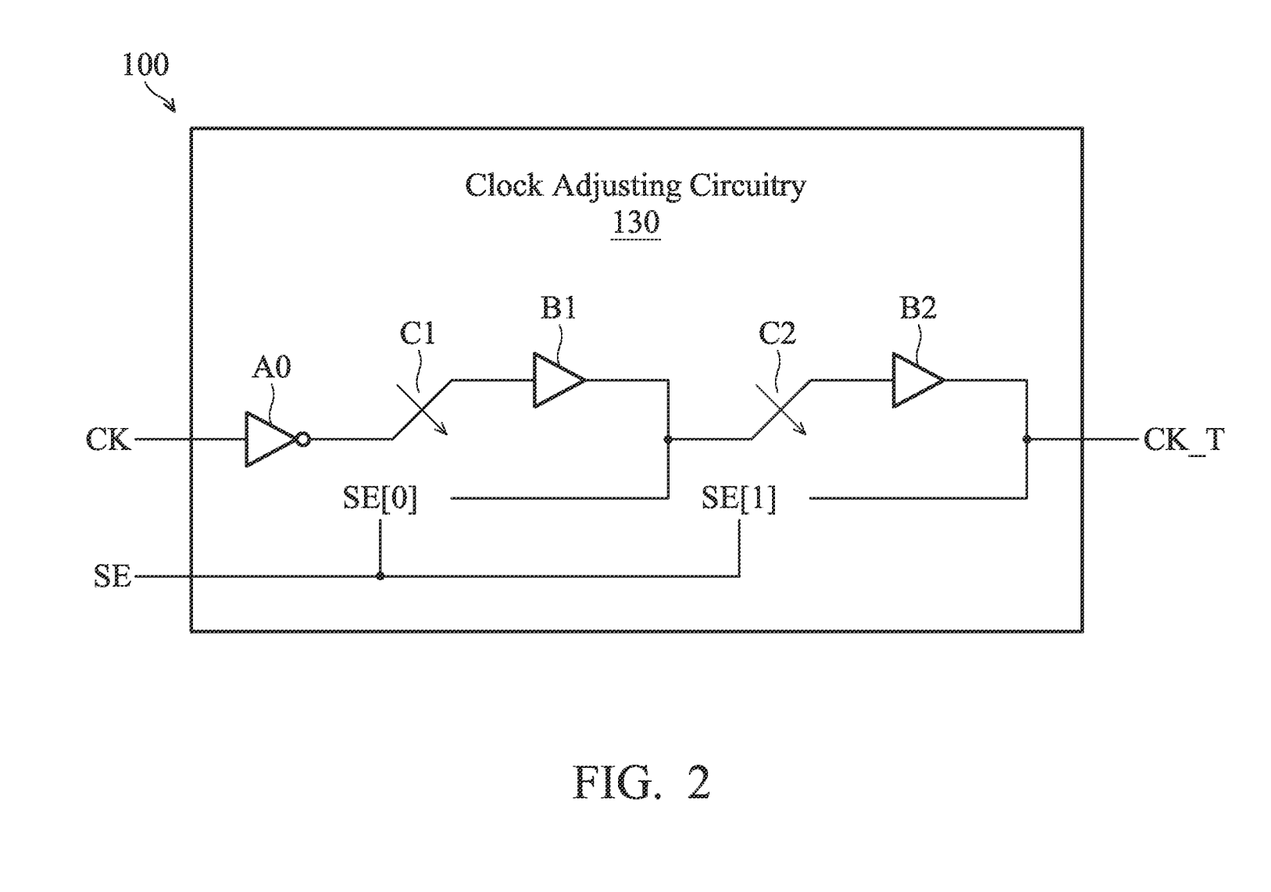
FIG. 2 is a block diagram of a clock adjusting circuitry according to one embodiment of the present invention.

FIG. 2 is a block diagram of a clock adjusting circuitry 130 according to one embodiment of the present invention. In one embodiment, the memory-testing device 100 further comprises a clock adjusting circuitry 130 to adjust or modulate the original clock signal CK to obtain the testing clock signal CK_T. In another embodiment, the testing clock signal CK_T is from an external clock signal CK_E (not shown) that is different from the original clock signal CK, and the memory-testing device 100 includes a clock adjusting circuitry 130 to adjust or modulate the external clock signal CK_E to obtain the testing clock signal CK_T. The clock adjusting circuitry 130 can also be located or included in other devices or modules, such as the testing circuitry 120. In addition, the original clock signal CK and the external clock signal CK_E could be generated by the same clock source or different clock sources.

Specifically, the clock adjusting circuitry 130 could include at least one inverter, a logic component, a buffer, a phase shifter and/or a multiplexer to modulate the original clock signal CK or the external clock signal CK_E. For example, as shown in FIG. 2, the clock adjusting circuitry 130 includes an inverter A0, two logic components B1 and B2, and two switches C1 and C2. In one embodiment, a selection signal SE is received by the clock adjusting circuitry 130. The two bits of the selection signal SE are utilized for controlling the two switches C1 and C2 in order to adjust the waveform or the duty cycle of the original clock signal CK for obtaining the testing clock signal CK_T.

Figure 3A:
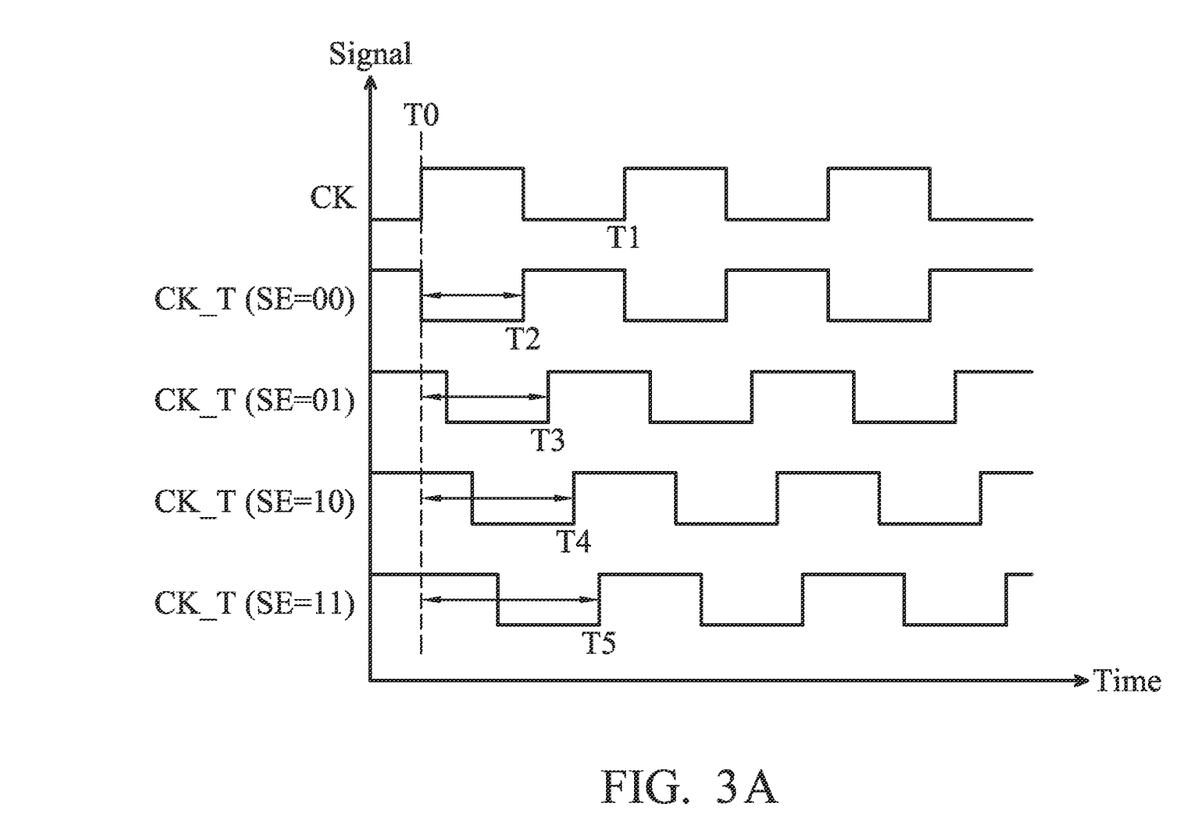
FIG. 3A is a timing diagram showing the original clock signal and the testing clock signal according to one embodiment of the present invention.

FIG. 3A is a timing diagram showing the original clock signal CK and the testing clock signal CK_T according to one embodiment of the present invention. The original clock signal CK is received and modulated by the clock adjusting circuitry 130 to obtain one of the four kinds of testing clock signals CK_T according to the selection signal SE of 00, 01, 10 and 11. In the embodiment shown in FIG. 3A, the negative edge which means the time when the signal changes from a low level to a high level such as T0 and T1 could be applied to the testing clock signals CK_T, and the memory-testing device latches data at the negative edge. In other words, the negative edges are utilized or applied to the testing clock signals CK_T for adjusting the time of latching data.

For example, the selection signal SE of 00 means the logic components B1 and B2 are disabled, and only the inverter A0 is enabled. For example, the components B1 and B2 could be a buffer, a phase shifter and/or a multiplexer The original clock signal CK is inverted without being delayed or advanced and becomes the testing clock signal CK_T (SE=00). In this embodiment, the next negative edge after T0 of the original clock signal CK is T1, but the next negative edge after T0 of the testing clock signal CK_T (SE=00) is T2. The trigger duration of the testing clock signal CK_T (SE=00) from T0 to T2 is half of the clock cycle. It should be noted that the time when the memory-testing device 100 latches data is advanced by half of the clock cycle because T2 of the testing clock signal CK_T (SE=00) is more advanced than T1 of the original clock signal CK by half of the clock cycle. Therefore, the timing slack of the memory-testing device 100 could be decreased by applying the testing clock signals CK_T.

In other embodiments as shown in FIG. 3A, the next negative edges after T0 of the other three testing clock signals CK_T (SE=01), CK_T (SE=10) and CK_T (SE=11) are T3, T4 and T5, respectively. The trigger duration (T0 to T3) of the testing clock signal CK_T (SE=01) is longer than the trigger duration (T0 to T2) of the testing clock signal CK_T (SE=00), and the trigger duration (T0 to T4) of the testing clock signal CK_T (SE=10) is longer than the trigger duration (T0 to T3) of the testing clock signal CK_T (SE=01), and the trigger duration (T0 to T5) of the testing clock signal CK_T (SE=11) is longer than the trigger duration (T0 to T4) of the testing clock signal CK_T (SE=10). In other words, the time when the memory-testing device 100 latches data with the testing clock signal CK_T (SE=01) is later than that with the testing clock signal CK_T (SE=00), and the time when the memory-testing device 100 latches data with the testing clock signal CK_T (SE=10) is later than that with the testing clock signal CK_T (SE=01), and the time when the memory-testing device 100 latches data with the testing clock signal CK_T (SE=11) is later than that with the testing clock signal CK_T (SE=10). However, all of the time when the memory-testing device 100 latches data with the testing clock signals CK_T (SE=00), CK_T (SE=01), CK_T (SE=10) and CK_T (SE=11) are earlier than that with the original clock signal CK, and all of the trigger durations of the testing clock signals CK_T (SE=00), CK_T (SE=01), CK_T (SE=10) and CK_T (SE=11) are equal to or more than half of the clock cycle.

Figure 3B:
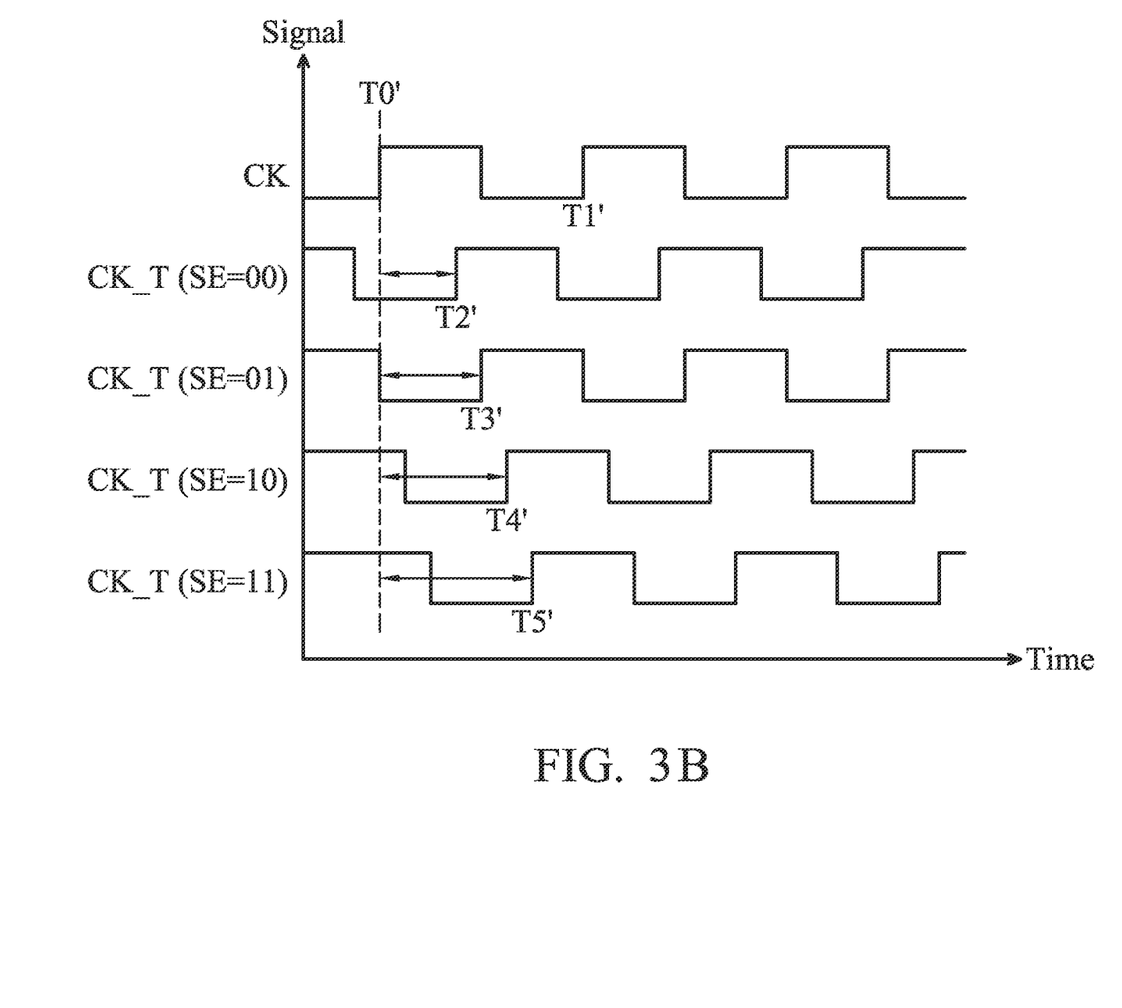
FIG. 3B is another timing diagram showing the original clock signal and the testing clock signal according to one embodiment of the present invention.

For further illustration, the time when the memory-testing device 100 latches data can be adjusted dynamically or in real-time by the testing clock signals CK_T (SE=00), CK_T (SE=01), CK_T (SE=10) and CK_T (SE=11) with different waveforms or delays or duty cycles. Specifically, the waveforms or delays or duty cycles of the testing clock signals CK_T can be modulated or regulated by the clock adjusting circuitry 130. FIG. 3B is another timing diagram showing the original clock signal CK' and the testing clock signal CK_T' according to one embodiment of the present invention. In this embodiment, the trigger duration of the testing clock signal CK_T (SE=00) from T0' to T2' is less than half of the clock cycle, and the time when the memory-testing device 100 latches data with the testing clock signals CK_T (SE=00) is much earlier than that with the original clock signal CK'. In addition, other kinds of the testing clock signals CK_T (SE=01), CK_T (SE=10) and CK_T (SE=11) can also be modulated by the clock adjusting circuitry 130 with different selection signals SE.

Figure 4A:
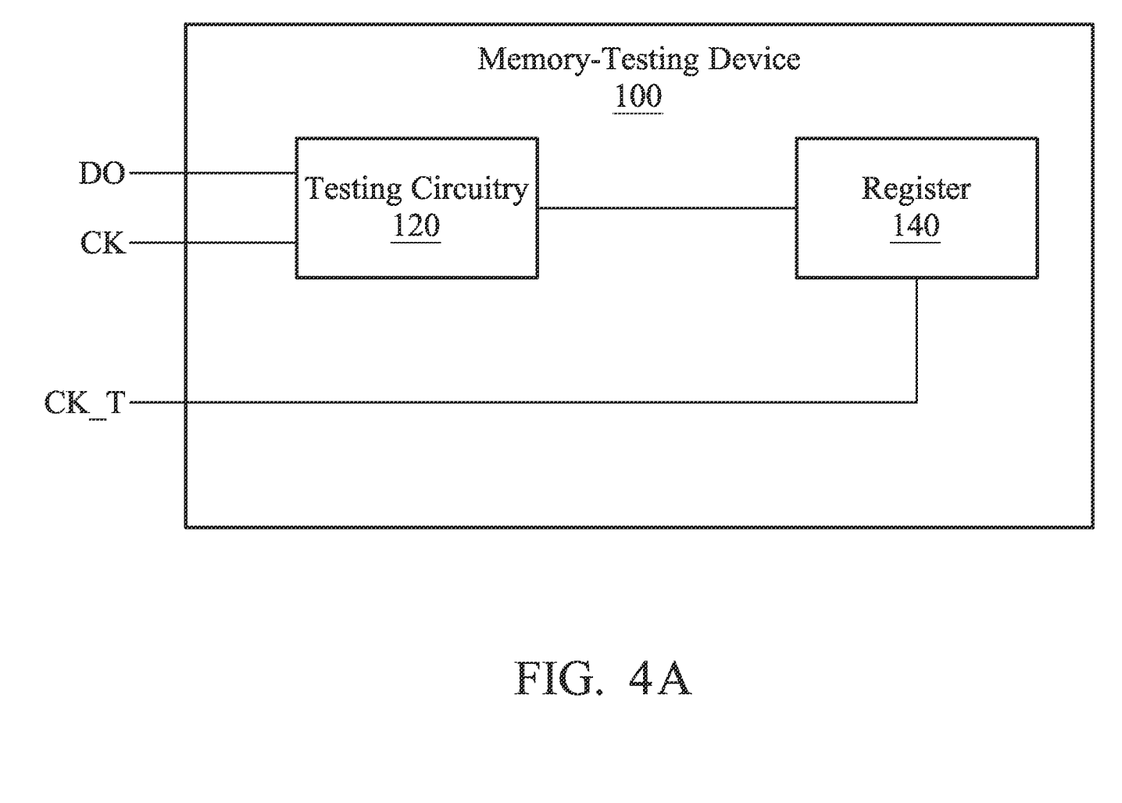
FIG. 4A is a block diagram showing a memory-testing device according to one embodiment of the present invention.
Figure 4B:
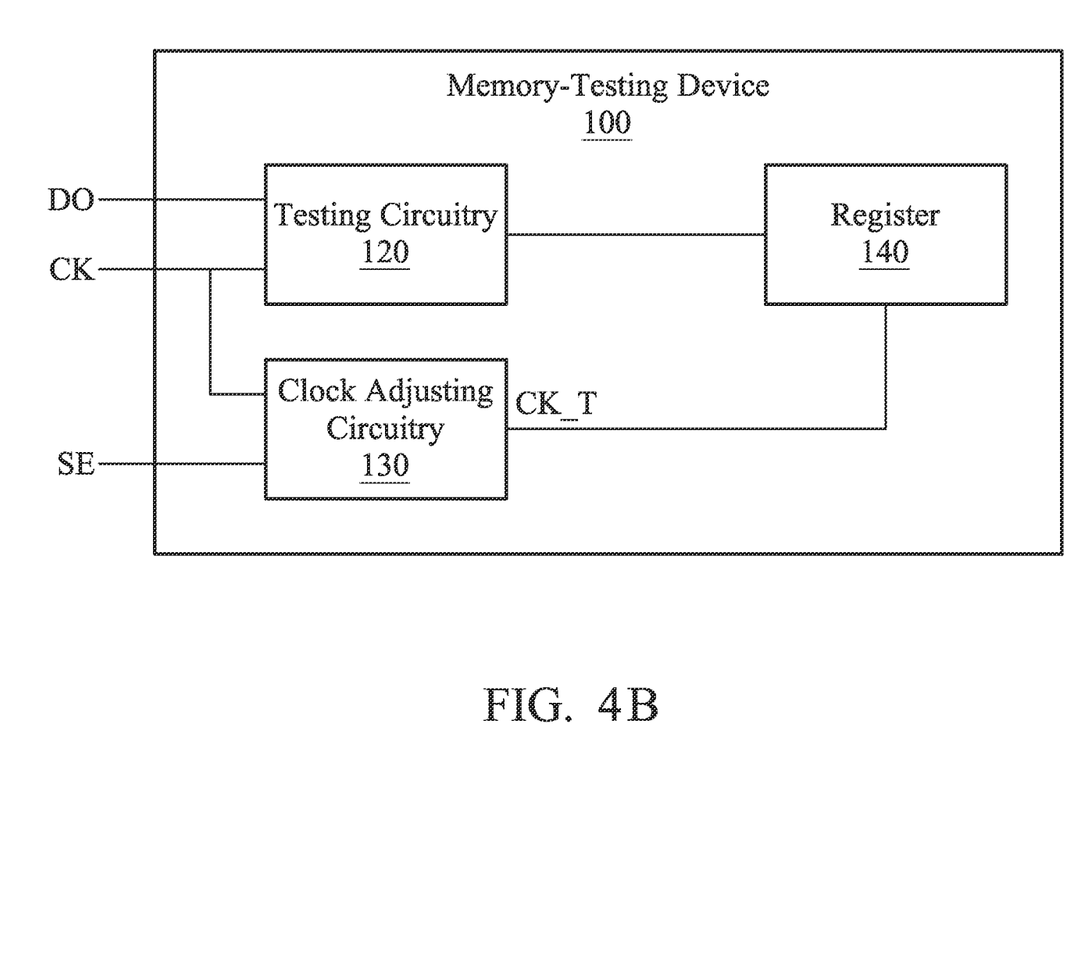
FIG. 4B is another block diagram showing a memory-testing device according to one embodiment of the present invention.
Figure 4C:
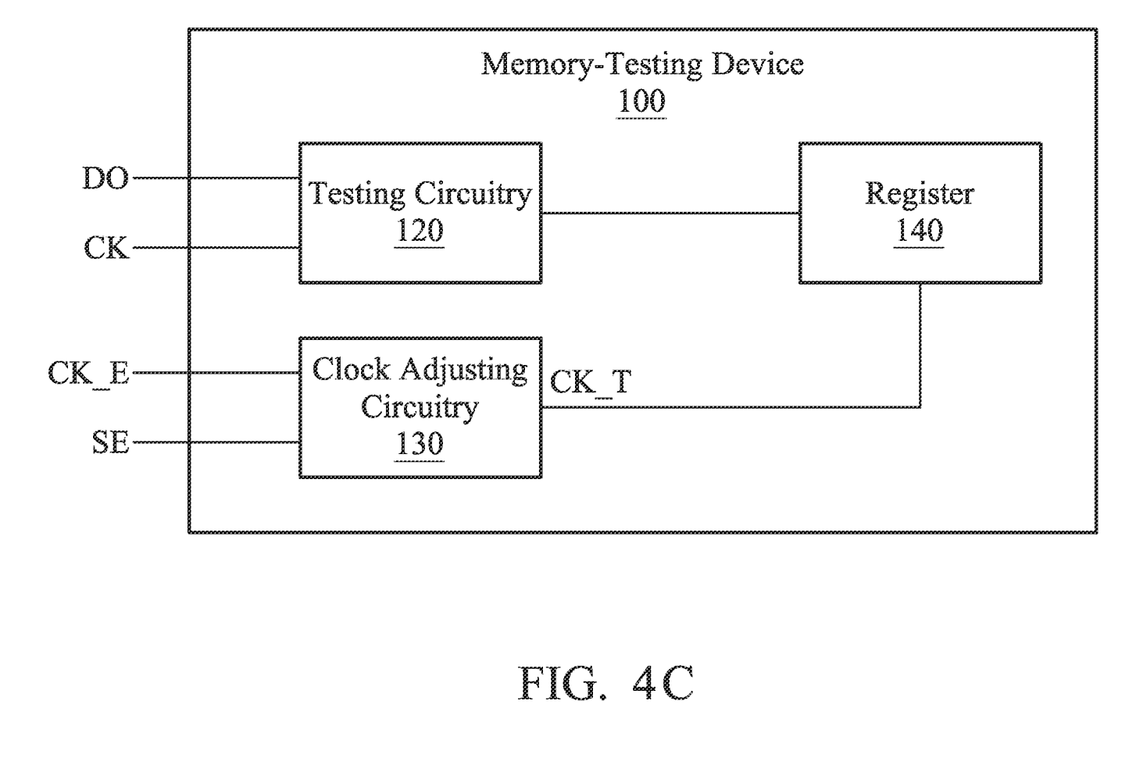
FIG. 4C is another block diagram showing a memory-testing device with an external clock signal according to one embodiment of the present invention.

FIG. 4A is a block diagram showing a memory-testing device 100 according to one embodiment of the present invention. The original clock signal CK is transmitted to the testing circuitry 120 and the testing clock signals CK_T is transmitted to the register 140. The clock signals of the testing circuitry 120 and the register 140 are different. FIG. 4B is another block diagram showing a memory-testing device 100 according to one embodiment of the present invention. In this embodiment, the memory-testing device 100 further includes a clock signal adjusting circuitry 130 for adjusting the original clock signal CK with the selection signal SE to obtain the testing clock signal CK_T. FIG. 4C is another block diagram showing a memory-testing device 100 with an external clock signal CK_E according to one embodiment of the present invention. Compared to the embodiment as shown in FIG. 4B, the clock signal adjusting circuitry 130 as shown in FIG. 4C receives the external clock signal CK_E (i.e., the first external clock signal) rather than the original clock signal CK. In some embodiments, if the speed of the clock signal of the memory 160 is faster than the speed of the clock signal of the system 10, the external clock signal CK_E could be transmitted to the memory-testing device 100. If the speed of the clock signal of the memory 160 is slower than that of the system 10, the original clock signal CK could be transmitted to the memory-testing device 100.

Figure 4D:
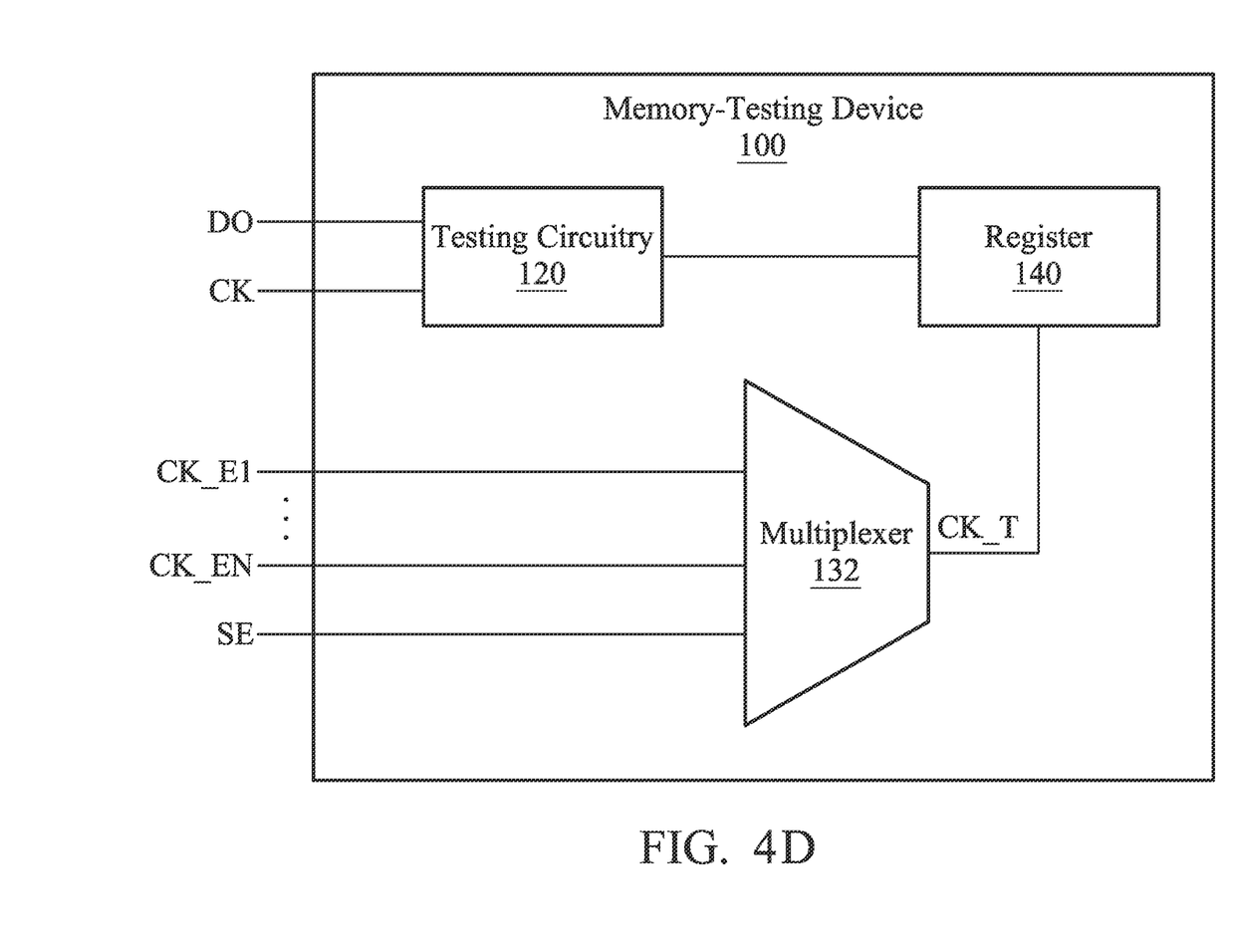
FIG. 4D is another block diagram showing a memory-testing device with a multiplexer and an external clock signal according to one embodiment of the present invention.
Figure 4E:
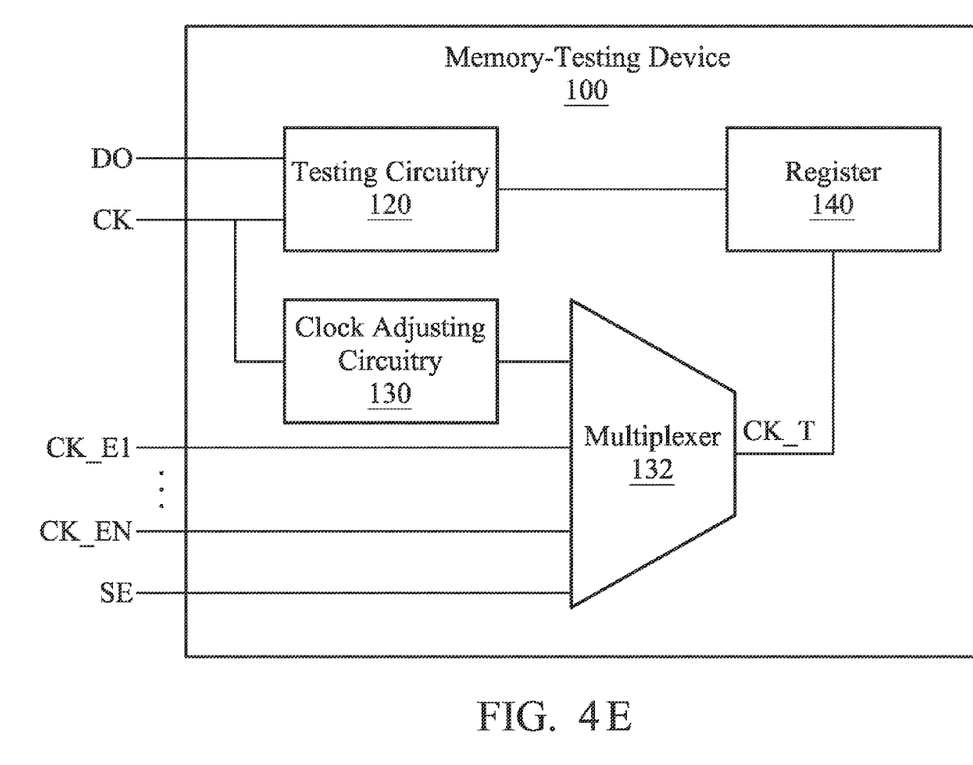
FIG. 4E is another block diagram showing a memory-testing device with a multiplexer and external clock signals according to one embodiment of the present invention.

FIG. 4D is another block diagram showing a memory-testing device 100 with a multiplexer 132 and an external clock signal CK_E according to one embodiment of the present invention. In this embodiment, the multiplexer 132 receives and multiplexes the external clock signal CK_E1 and at least one other external clock signal CK_EN to obtain the testing clock signal CK_T. FIG. 4E is another block diagram showing a memory-testing device 100 with a multiplexer 132 and external clock signals CK_E1 to CK_EN according to one embodiment of the present invention. Compared to the embodiment as shown in FIG. 4D, the multiplexer 132 as shown in FIG. 4E is coupled to the clock signal adjusting circuitry 130 for further receiving the signal outputted from the clock signal adjusting circuitry 130. It should be noted that the above descriptions of the memory-testing device 100 are made for illustrating the general principles of the invention and should not be taken as a limitation. For example, the multiplexer 132 could also be coupled between the testing circuitry 120 and the clock signal adjusting circuitry 130.

Figure 5:
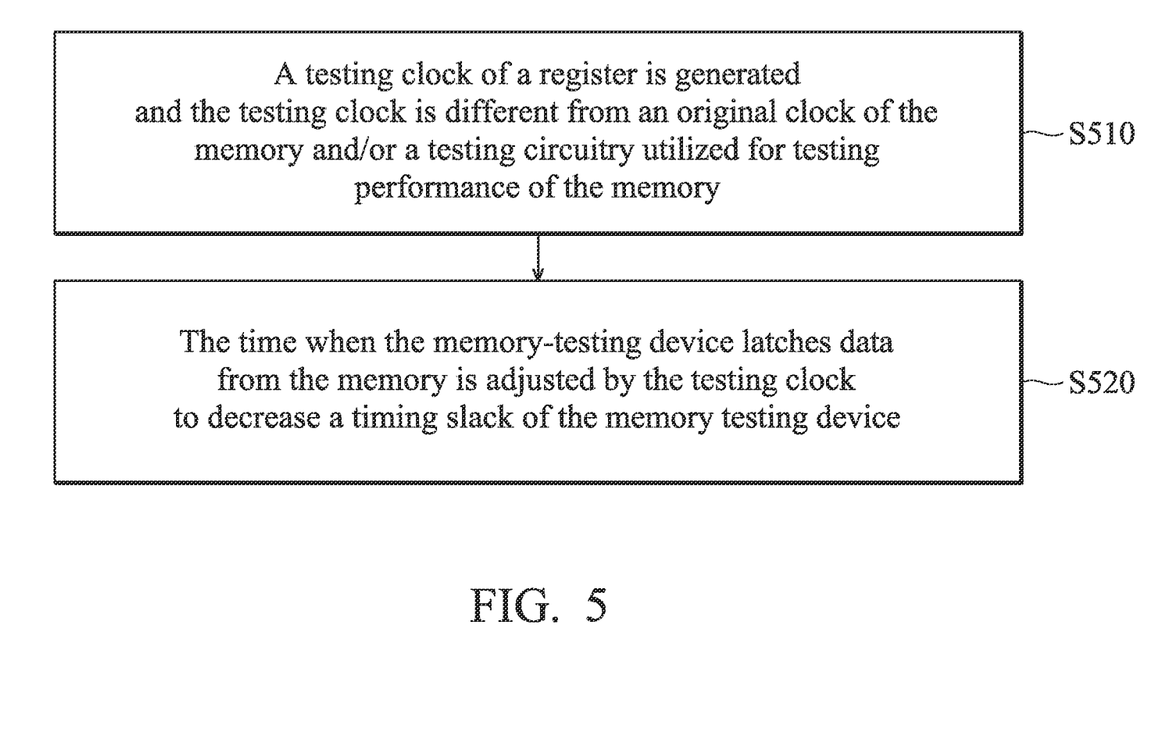
FIG. 5 is a flowchart of a memory-testing method according to one embodiment of the present invention.

FIG. 5 is a flowchart of a memory-testing method according to one embodiment of the present invention. In step S510, a testing clock signal CK_T of a register 140 is generated and the testing clock signal CK_T is different from an original clock signal CK of the memory 160 and/or a testing circuitry 120. The testing circuitry 120 is utilized for testing the performance of the memory 160. Afterwards, in step S520, the time when the memory-testing device 100 latches data from the memory 160 is adjusted by the testing clock signal CK_T to decrease the timing slack of the memory-testing device 100. Various methods for generating the testing clock signal CK_T and adjusting the data latch of the memory-testing device 100 have been illustrated before, and therefore, they will not be described again here.

Figure 6:
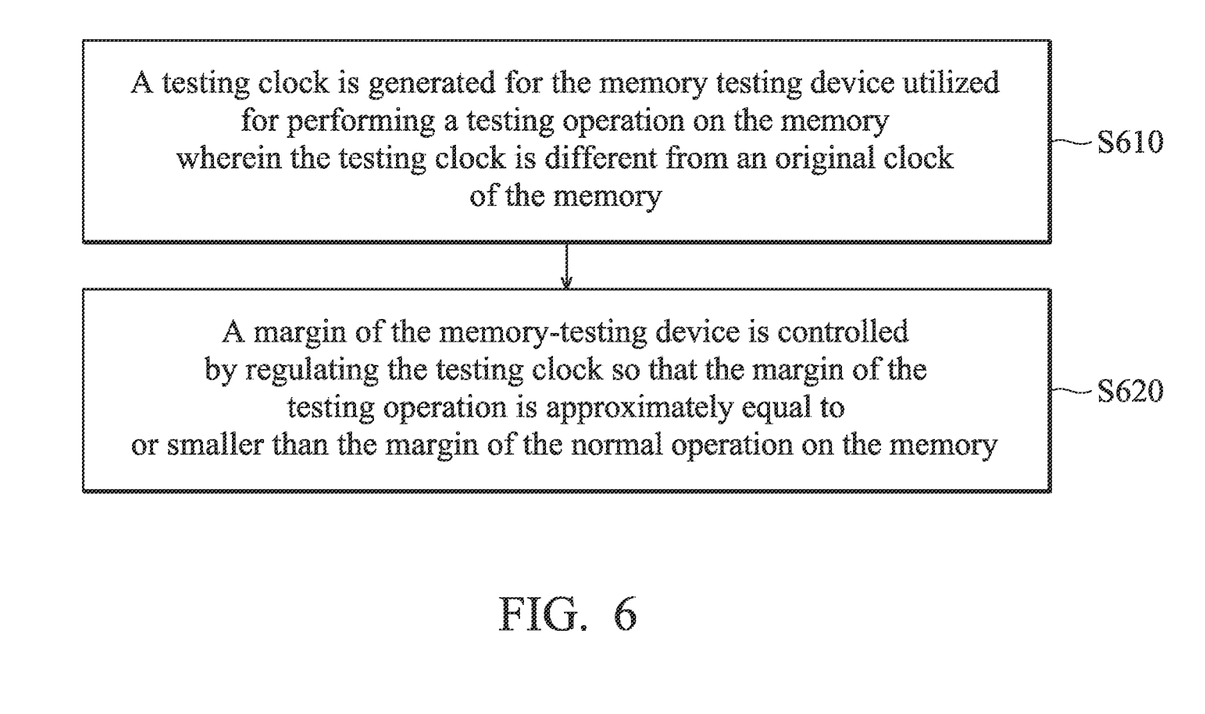
FIG. 6 is another flowchart of a memory-testing method according to one embodiment of the present invention.

FIG. 6 is another flowchart of a memory-testing method according to one embodiment of the present invention. In step S610, a testing clock signal CK_T is generated for the memory-testing device 100 which is utilized for performing a test mode of the memory 160, and the testing clock signal CK_T is different from an original clock signal CK of the memory 160. Afterwards, in step S620, a margin of the memory-testing device 100 is controlled by regulating the testing clock signal CK_T so that the margin of the test mode is approximately equal to or smaller than the margin of the normal operation of the memory 160. In other words, the margin while the memory 160 is in test mode is approximately equal to or smaller than the margin while the memory 160 is in functional mode. It should be noted that when the memory 160 is accessed or operated on the functional mode for normal operation, the corresponding timing paths of the functional mode are the first timing path TP1 and the second timing path TP2 as shown in FIG. 1A. When the memory 160 is accessed or operated on the test mode, the corresponding timing paths of the test mode are the first timing path TP1 and the third timing path TP3. Specifically, the third timing path TP3 is tighter than the second timing path TP2 by adjusting or regulating the testing clock signal CK_T, and the margin of the test mode would be approximately equaled to or smaller than the margin of the normal operation to provide a memory-testing method and a memory-testing device with better accuracy and reliability.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A memory-testing device for testing a memory accessed in a functional mode through a first timing path or in a test mode through a second timing path, comprising:
 a testing circuitry, disposed on the second timing path and coupled to the memory for testing performance of the memory; and
 a register, disposed on the second timing path and coupled to the testing circuitry and inputted by a testing clock signal, wherein the testing clock signal is different from an original clock signal of the memory and/or the testing circuitry, and the testing clock signal is utilized for adjusting the time when the memory-testing device latches data from the memory to decrease a timing margin of the second timing path for the test mode to be approximately equal to or smaller than a timing margin of the first timing path for the functional mode, and
 wherein the first timing path is different from the second timing path.

2. The memory-testing device as claimed in claim 1, wherein the memory-testing device further comprises a clock adjusting circuitry to adjust the original clock signal to obtain the testing clock signal.

3. The memory-testing device as claimed in claim 2, wherein the memory-testing device further comprises a multiplexer coupled to the clock adjusting circuitry, and the multiplexer receives and multiplexes a signal outputted from the clock adjusting circuitry, a first external clock signal different from the original clock signal, and at least one second external clock signal different from the original clock signal and the first external clock signal to obtain the testing clock signal.

4. The memory-testing device as claimed in claim 1, wherein the testing clock signal is from a first external clock signal different from the original clock signal.

5. The memory-testing device as claimed in claim 4, wherein the memory-testing device further comprises a multiplexer which receives and multiplexes the first external clock signal and at least one second external clock signal different from the original clock signal and the first external clock signal to obtain the testing clock signal.

6. The memory-testing device as claimed in claim 4, wherein the memory-testing device further comprises a clock adjusting circuitry to adjust the first external clock signal to obtain the testing clock signal.

7. The memory-testing device as claimed in claim 5, wherein the clock adjusting circuitry adjusts the first external clock signal and at least one second external clock signal different from the original clock signal and the first external clock signal to obtain the testing clock signal.

8. The memory-testing device as claimed in claim 1, wherein the testing circuitry is coupled between the memory and the register, or the register is coupled between the memory and the testing circuitry.

9. The memory-testing device as claimed in claim 1, wherein the testing circuitry compares the data with a golden value for inspecting accuracy of the data from the memory, and the register stores the data outputted by the testing circuitry.

10. A memory-testing method for testing a memory accessed in a functional mode through a first timing path or in a test mode through a second timing path, comprising:
 generating a testing clock signal of a register of a memory-testing device disposed on the second timing path wherein the testing clock signal is different from an original clock signal of the memory and/or a testing circuitry utilized for testing performance of the memory; and
 adjusting the time when the memory-testing device latches data from the memory by the testing clock signal to decrease a timing margin of the second timing path for the test mode to be approximately equal to or smaller than a timing margin of the first timing path for the functional mode,
 wherein the first timing path is different form the second timing path.

11. The memory-testing method as claimed in claim 10, wherein generating the testing clock signal comprises adjusting the original clock signal to obtain the testing clock signal.

12. The memory-testing method as claimed in claim 10, further comprising generating the testing clock signal from a first external clock signal different from the original clock signal.

13. The memory-testing method as claimed in claim 12, further comprising adjusting the first external clock signal to obtain the testing clock signal.

14. The memory-testing method as claimed in claim 13, further comprising adjusting the first external clock signal and at least one second external clock signal different from the original clock signal and the first external clock signal to obtain the testing clock signal.

15. The memory-testing method as claimed in claim 10, wherein the testing circuitry is coupled between the memory and the register, or the register is coupled between the memory and the testing circuitry.

16. The memory-testing method as claimed in claim 10, further comprising comparing the data with a golden value by the testing circuitry for inspecting accuracy of the data from the memory and storing the data outputted by the register.

17. A memory-testing method for testing a memory accessed in a functional mode through a first timing path or in a test mode through a second timing path, comprising:

generating a testing clock signal for a memory-testing device disposed on the second timing path and utilized for operating the test mode on the memory wherein the testing clock signal is different from an original clock signal of the memory; and controlling a margin of the memory-testing device by regulating the testing clock signal to decrease a timing margin of the second timing path for the test mode to be approximately equal to or smaller than a timing margin of the first timing path for the functional mode, wherein the first timing path is different form the second timing path.

18. The memory-testing method as claimed in claim 17, wherein regulating the testing clock signal comprises adjusting a waveform of the testing clock signal to regulate the time when the memory-testing device latches data from the memory.

19. The memory-testing method as claimed in claim 17, wherein generating the testing clock signal comprises adjusting the original clock signal to obtain the testing clock signal.

20. The memory-testing method as claimed in claim 17, further comprising generating the testing clock signal from a first external clock signal different from the original clock signal.

21. The memory-testing method as claimed in claim 20, further comprising adjusting the first external clock signal to obtain the testing clock signal.

22. The memory-testing method as claimed in claim 21, further comprising adjusting the first external clock signal and at least one second external clock signal different from the original clock signal and the first external clock signal to obtain the testing clock signal.

* * * * *